(12) United States Patent
Sung et al.

(10) Patent No.: US 12,613,289 B2
(45) Date of Patent: Apr. 28, 2026

(54) BATTERY DIAGNOSIS APPARATUS, BATTERY PACK, ELECTRIC VEHICLE, AND BATTERY DIAGNOSIS METHOD

(71) Applicant: LG Energy Solution, Ltd., Seoul (KR)

(72) Inventors: Yong-Chul Sung, Daejeon (KR);
Cheol-Taek Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 183 days.

(21) Appl. No.: 18/277,239

(22) PCT Filed: Sep. 27, 2022

(86) PCT No.: PCT/KR2022/014494
§ 371 (c)(1),
(2) Date: Aug. 15, 2023

(87) PCT Pub. No.: WO2023/063625
PCT Pub. Date: Apr. 20, 2023

(65) Prior Publication Data
US 2024/0133972 A1 Apr. 25, 2024
US 2024/0230784 A9 Jul. 11, 2024

(30) Foreign Application Priority Data

Oct. 13, 2021 (KR) ........................ 10-2021-0136165

(51) Int. Cl.
*G01R 31/396* (2019.01)
*G01R 31/3835* (2019.01)
*G01R 31/52* (2020.01)
(52) U.S. Cl.
CPC ....... *G01R 31/396* (2019.01); *G01R 31/3835* (2019.01); *G01R 31/52* (2020.01)

(58) Field of Classification Search
CPC .. G01R 31/396; G01R 31/3835; G01R 31/52; G01R 31/367; G01R 31/392;
(Continued)

(56) References Cited

U.S. PATENT DOCUMENTS

2010/0066379 A1* 3/2010 Lida ........................ H02J 7/005
324/434
2010/0188054 A1 7/2010 Asakura et al.
(Continued)

FOREIGN PATENT DOCUMENTS

JP 2009085676 A 4/2009
JP 2014134467 A 7/2014
(Continued)

OTHER PUBLICATIONS

International Search Report for Application No. PCT/KR2022/014494 mailed Jan. 9, 2023. 3 pages.
(Continued)

*Primary Examiner* — Giovanni Astacio-Oquendo
*Assistant Examiner* — Haidong Zhang
(74) *Attorney, Agent, or Firm* — Lerner David LLP

(57) ABSTRACT

A battery diagnosis apparatus includes a battery monitor to detect a voltage of each of a plurality of battery cells included in a battery module; and a control circuit to determine a latest value of a first voltage deviation indicating a difference between a voltage behavior of each battery cell and an average voltage behavior of the plurality of battery cells over a relaxation period from a start time of a resting event.

15 Claims, 11 Drawing Sheets

(58) Field of Classification Search
CPC .............. G01R 31/3648; G01R 19/10; G01R 19/16528; G01R 19/16542; G01R 31/382; B60L 58/16; B60L 2240/547; B60L 3/0046; B60L 58/10; B60L 58/18; Y02E 60/10
See application file for complete search history.

(56) References Cited

U.S. PATENT DOCUMENTS

| | | | |
|---|---|---|---|
| 2010/0211341 A1* | 8/2010 | Kinoshita | G01R 31/3842 |
| | | | 702/63 |
| 2011/0148426 A1 | 6/2011 | Yokotani | |
| 2012/0046893 A1* | 2/2012 | Kaneko | B60L 58/21 |
| | | | 702/63 |
| 2014/0266229 A1 | 9/2014 | McCoy | |
| 2015/0234015 A1* | 8/2015 | Park | G01R 31/396 |
| | | | 702/63 |
| 2015/0357852 A1* | 12/2015 | Nakao | H01M 10/48 |
| | | | 702/63 |
| 2019/0181663 A1 | 6/2019 | Nishikawa et al. | |
| 2020/0025832 A1 | 1/2020 | Cho et al. | |
| 2020/0072912 A1 | 3/2020 | Chun et al. | |
| 2020/0287251 A1 | 9/2020 | Yonekura et al. | |
| 2021/0111568 A1 | 4/2021 | Cho et al. | |
| 2022/0196752 A1 | 6/2022 | Lee et al. | |

FOREIGN PATENT DOCUMENTS

| | | |
|---|---|---|
| JP | 2019209811 A | 12/2019 |
| KR | 20150132370 A | 11/2015 |
| KR | 20200011014 A | 1/2020 |
| KR | 20200024637 A | 3/2020 |
| KR | 20210042679 A | 4/2021 |
| KR | 20210054331 A | 5/2021 |
| WO | 2018043222 A1 | 3/2018 |
| WO | 2019069390 A1 | 4/2019 |

OTHER PUBLICATIONS

Extended European Search Report including Written Opinion for Application No. 22881254.1 dated Sep. 20, 2024, pp. 1-6.

* cited by examiner

Second voltage deviation(V)

0.002
0.000
-0.002
-0.004
-0.006
-0.008
-0.010

0          20          40          60          80

Event number x(Resting event)

Figure 10:
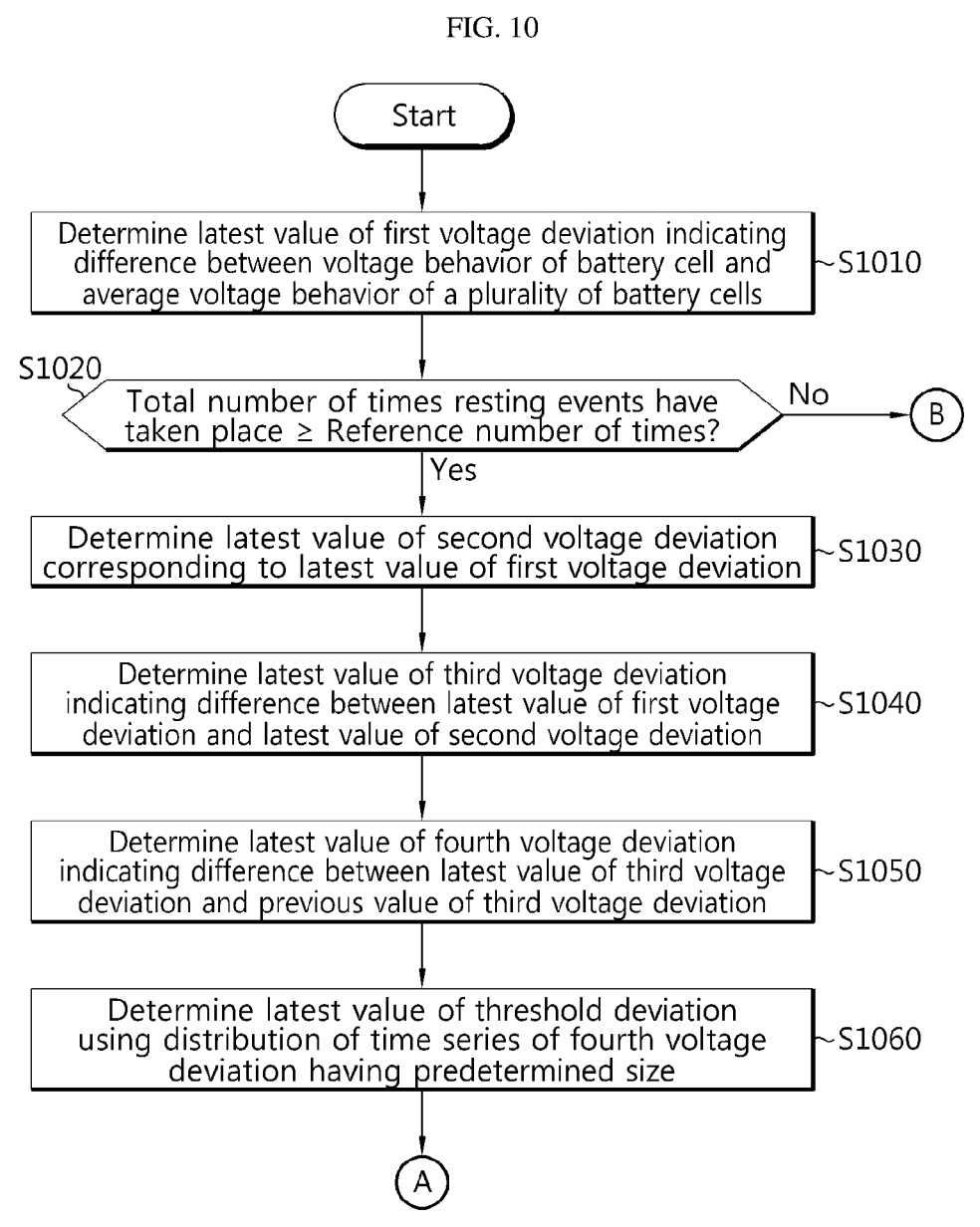

Start

Determine latest value of first voltage deviation indicating difference between voltage behavior of battery cell and average voltage behavior of a plurality of battery cells ⎯ S1010

S1020

Total number of times resting events have taken place ≥ Reference number of times?  No → Ⓑ

Yes

Determine latest value of second voltage deviation corresponding to latest value of first voltage deviation ⎯ S1030

Determine latest value of third voltage deviation indicating difference between latest value of first voltage deviation and latest value of second voltage deviation ⎯ S1040

Determine latest value of fourth voltage deviation indicating difference between latest value of third voltage deviation and previous value of third voltage deviation ⎯ S1050

Determine latest value of threshold deviation using distribution of time series of fourth voltage deviation having predetermined size ⎯ S1060

Ⓐ

1

BATTERY DIAGNOSIS APPARATUS, BATTERY PACK, ELECTRIC VEHICLE, AND BATTERY DIAGNOSIS METHOD

CROSS-REFERENCE TO RELATED APPLICATION

The present application is a national phase entry under 35 U.S.C. § 371 of International Application No. PCT/KR2022/014494 filed on Sep. 27, 2022 which claims priority to Korean Patent Application No. 10-2021-0136165 filed on Oct. 13, 2021 in the Republic of Korea, the disclosures of which are incorporated herein by reference.

TECHNICAL FIELD

The present disclosure relates to micro short circuit diagnosis in each battery cell from voltage behaviors of the battery cells at rest.

BACKGROUND ART

Recently, there has been a rapid increase in the demand for portable electronic products such as laptop computers, video cameras and mobile phones, and with the development of electric vehicles, batteries for energy storage, robots and satellites, many studies are being made on high performance batteries that can be repeatedly recharged.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

To meet the high voltage and high capacity requirements of applications such as electric vehicles, battery systems (for example, battery packs) including a series connection structure of batteries are widespread.

In the battery systems, there is a high possibility that a fault in a certain battery cell will adversely affect the overall performance and safety of the battery systems. Accordingly, in the management of the battery systems, it is important to accurately detect a fault in the individual battery cell.

Among various fault types of battery cells, a micro short circuit (also referred to as an internal short circuit) is a typical type defect that directly/indirectly affects fires. The micro short circuit is caused by side reactions (for example, lithium metal deposition) in the battery cells and/or impurity infiltration into the battery cells.

The micro short circuit detection usually employs comparing a reference value with the internal resistance of the battery cell continuously monitored during charging and discharging. However, the internal resistance estimation basically requires not only a voltage but also a detected current value for each battery cell, and the internal resistance greatly relies on a variety of internal and external conditions, resulting in low accuracy.

SUMMARY

Technical Problem

The present disclosure is designed to solve the above-described problem, and therefore the present disclosure is directed to providing an apparatus and method for detecting a micro short circuit having a strong correlation to voltage behavior by monitoring a trend in voltage behavior during the rest of a battery cell with repeated resting events.

These and other objectives and advantages of the present disclosure may be understood by the following description and will be apparent from an embodiment of the present disclosure. In addition, it will be readily understood that the objectives and advantages of the present disclosure may be realized by the means set forth in the appended claims and a combination thereof.

Technical Solution

A battery diagnosis apparatus according to an aspect of the present disclosure includes a battery monitor configured to detect a voltage of each of a plurality of battery cells included in a battery module; and a control circuit configured to determine a latest value of a first voltage deviation indicating a difference between a voltage behavior of each of the plurality of battery cells and an average voltage behavior of the plurality of battery cells over a relaxation period from a start time of a resting event in which the battery module transitions from charging to resting. When a total number of times the resting event has taken place is equal to or larger than a reference number of times, the control circuit is configured to determine, for each battery cell of the plurality of battery cells, a latest value of a second voltage deviation of the battery cell, wherein the second voltage deviation corresponds to the latest value of the first voltage deviation applied to. The control circuit is configured to determine, for each battery cell, a latest value of a third voltage deviation of the battery cell indicating a first difference between the latest value of the first voltage deviation and the latest value of the second voltage deviation. The control circuit is configured to determine, for each battery cell, a latest value of a fourth voltage deviation of the battery cell indicating a second difference between the latest value of the third voltage deviation and a previous value of the third voltage deviation. The control circuit is configured to determine, for each battery cell, a latest value of a threshold deviation of the battery cell using a dispersion of a time series of the fourth voltage deviation having a predetermined size. The control circuit is configured to determine, for each battery cell, whether the plurality of battery cell has a micro short circuit based on a comparison of the latest value of the third voltage deviation with the latest value of the threshold deviation.

The voltage behavior of the battery cell may indicate an average of a predetermined number of detected voltages of the battery cell over the relaxation period from the start time of the resting event.

The smoothing algorithm may be a moving average filter. The reference number of times may be equal to or greater than a size of the moving average filter.

The dispersion may be a standard deviation.

The control circuit may be configured to determine, for each of the plurality of battery cells, the latest value of the threshold deviation by multiplying the dispersion by a predetermined margin constant.

The control circuit may be configured to, for each of the plurality of battery cells, increase an abnormality factor associated with the corresponding battery cell by a first value when the latest value of the third voltage deviation is equal to or smaller than the latest value of the threshold deviation, and determine at least one of the plurality of battery cells has the micro short circuit when the abnormality factor associated with the at least one of the plurality of battery cells reaches a threshold.

The control circuit may be configured to decrease, the abnormality factor associated with the at least one of the plurality of battery cells by a second value when the latest value of the third voltage deviation is larger than the latest value of the threshold deviation.

A battery pack according to another aspect of the present disclosure includes the battery diagnosis apparatus.

An electric vehicle according to still another aspect of the present disclosure includes the battery pack.

A battery diagnosis method according to yet another aspect of the present disclosure includes determining a latest value of a first voltage deviation indicating a difference between a voltage behavior of each of a plurality of battery cells and an average voltage behavior of the plurality of battery cells over a relaxation period from a start time of a resting event in which a battery module including the plurality of battery cells transitions from charging to resting. When a total number of times the resting event has taken place is equal to or larger than a reference number of times, the battery diagnosis method further includes, for each battery cell of the plurality of battery cells, determining a latest value of a second voltage deviation of the battery cell, wherein the second voltage deviation corresponds to the latest value of the first voltage deviation applied to a smoothing algorithm; determining a latest value of a fourth voltage deviation of the battery cell indicating a second difference between a latest value of a third voltage deviation and a previous value of the third voltage deviation; determining a latest value of a threshold deviation of the battery cell using a dispersion of a time series of the fourth voltage deviation having a predetermined size; and determining a presence or absence of a micro short circuit in the corresponding battery cell based on a comparison of the latest value of the third voltage deviation with the latest value of the threshold deviation.

The voltage behavior of each of the plurality of battery cells may indicate an average a predetermined number of detected voltages of the battery cell over the relaxation period from the start time of the resting event.

The smoothing algorithm may be a moving average filter. The reference number of times may be equal to or greater than a size of the moving average filter.

The dispersion may be a standard deviation.

The latest value of the threshold deviation may be equal to a multiplication of the dispersion by a predetermined margin constant.

Advantageous Effects

According to at least one of the embodiments of the present disclosure, it is possible to detect a micro short circuit having a strong correlation to voltage behavior by monitoring a trend in voltage behavior during the rest of the plurality of battery cells with repeated resting events. Accordingly, it is possible to take appropriate protection actions for preventing the danger issues caused by the micro short circuit, such as explosions or fires in the battery cell.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate an exemplary embodiment of the present disclosure, and together with the detailed description of the present disclosure as described below, serve to provide a further understanding of the technical aspects of the present disclosure, and thus the present disclosure should not be construed as being limited to the drawings.

FIG. 3 is a diagram referenced in describing a time-dependent change in voltage of a battery cell during rest.

FIG. 4 is a graph exemplarily showing a time-dependent change in voltage behavior of a battery cell with repeated resting events.

FIG. 6 is a graph exemplarily showing a time-dependent change in second voltage deviation of a battery cell with repeated resting events.

FIG. 7 is a graph exemplarily showing a time-dependent change in third voltage deviation of a battery cell with repeated resting events.

FIG. 9 is a graph exemplarily showing a time-dependent change in threshold deviation for micro short circuit determination of a battery cell with repeated resting events.

FIGS. 10 and 11 are flowcharts referenced in exemplarily describing a battery diagnosis method according to an embodiment of the present disclosure.

DETAILED DESCRIPTION

Figure 1:
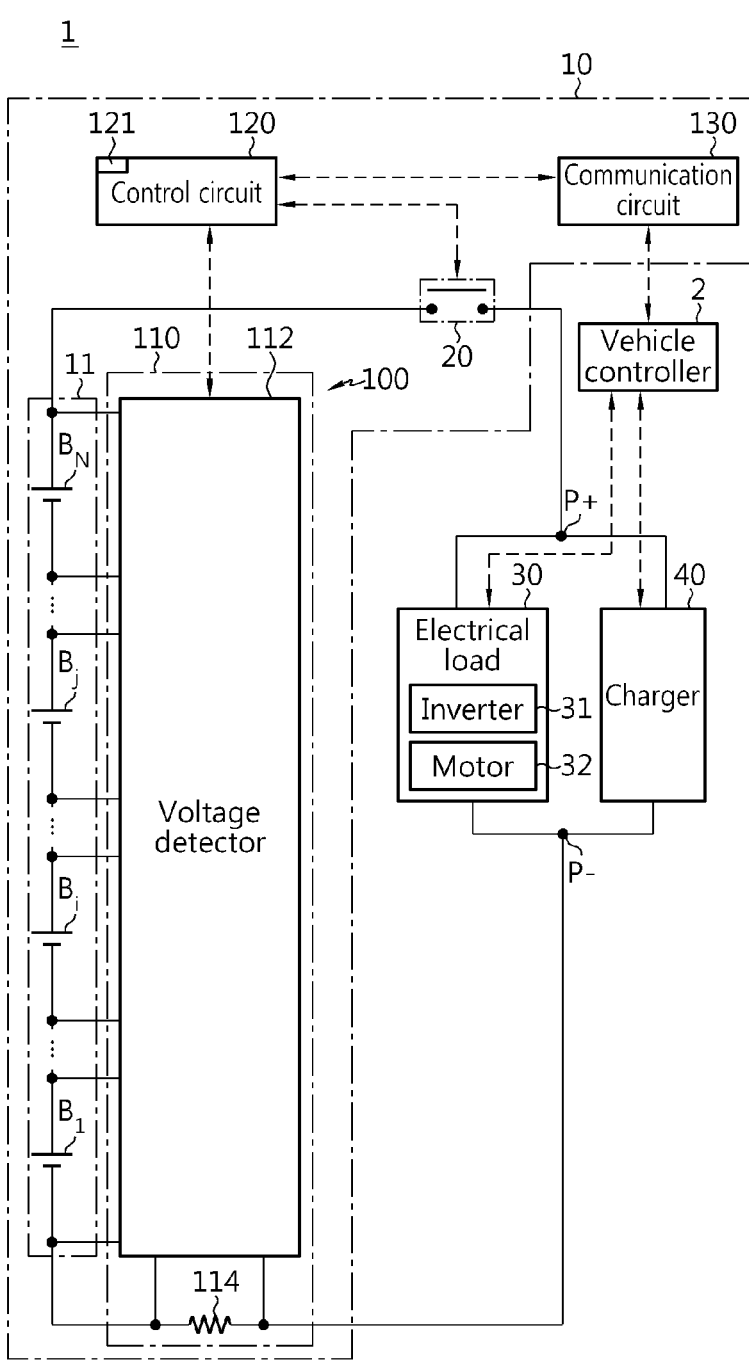
FIG. 1 is a diagram exemplarily showing an electric vehicle according to the present disclosure.

Hereinafter, exemplary embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are just an exemplary embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements.

Unless the context clearly indicates otherwise, it will be understood that the term "comprises" when used in this specification, specifies the presence of stated elements, but does not preclude the presence or addition of one or more other elements. Additionally, the term "unit" as used herein refers to a processing unit of at least one function or operation, and may be implemented in hardware and software either alone or in combination.

In addition, throughout the specification, it will be further understood that when an element is referred to as being "connected to" another element, it can be directly connected to the other element or intervening elements may be present.

FIG. 1 is a diagram exemplarily showing an electric vehicle according to the present disclosure.

Referring to FIG. 1, the electric vehicle 1 includes a vehicle controller 2, a battery pack 10 and an electrical load 30. Charge/discharge terminals P+, P− of the battery pack 10 may be electrically coupled to a charger 40 through a charging cable. The charger 40 may be included in the electric vehicle 1, or may be provided in a charging station outside of the electric vehicle 1.

The vehicle controller 2 (for example, an Electronic Control Unit (ECU)) is configured to transmit a key-on signal to a battery diagnosis apparatus 100 in response to an ignition button (not shown) of the electric vehicle 1 being switched to an on-position by a user. The vehicle controller 2 is configured to transmit a key-off signal to the battery diagnosis apparatus 100 in response to the ignition button being switched to an off-position by the user. The charger 40 may supply the charge power through the charge/discharge terminals P+, P− of the battery pack 10 via communication with the vehicle controller 2.

The battery pack 10 includes a battery module 11, a relay 20 and the battery diagnosis apparatus 100.

The battery module 11 includes a series connection structure of a plurality of battery cells $B_1 \sim B_N$ (N is a natural number of 2 or greater). That is, in the battery module 11, the plurality of battery cells $B_1 \sim B_N$ may be connected in series. The plurality of battery cells $B_1 \sim B_N$ may be manufactured with the same electrical and chemical specification. For example, the plurality of battery cells $B_1 \sim B_N$ is not limited to a particular type, and may include any type of battery cell that can be repeatedly recharged such as a lithium ion cell. Hereinafter, in the common description of the plurality of battery cells $B_1 \sim B_N$, the symbol '$B_j$' (j is a natural number of N or smaller) is affixed to indicate the battery cell.

The relay 20 is electrically connected in series to the battery module 11 through a power path connecting the battery module 11 to the electrical load 30. FIG. 1 shows the relay 20 connected between the positive terminal of the battery module 11 and one (P+) of the charge/discharge terminals. The on/off control of the relay 20 is performed in response to a switching signal from the battery diagnosis apparatus 100 and/or the vehicle controller 2. The relay 20 may be a mechanical contactor that is turned on/off by the magnetic force of the coil or a semiconductor switch such as Metal Oxide Semiconductor Field Effect transistor (MOS-FET).

The electrical load 30 includes an inverter 31 and an electric motor 32. The inverter 31 is provided to convert the direct current (DC) power from the battery module 11 included in the battery pack 10 to alternating current (AC) power in response to a command from the battery diagnosis apparatus 100 or the vehicle controller 2. The electric motor 32 operates using the AC power from the inverter 31. The electric motor 32 may include, for example, a 3-phase AC motor.

A state in which the battery module 11 is being charged and discharged by turning on the relay 20 may be referred to as a 'cycling state (or a load state)'.

When the relay 20 is switched from on to off, the battery module 11 is changed from the cycling state to a 'resting state (or a no-load state, a calendar state)', and voltage of the battery cell $B_j$ at rest may be referred to as a 'relaxation voltage (or a resting voltage, a no-load voltage)'. The relaxation voltage after a sufficient period of time has elapsed since the battery cell $B_j$ was switched from charge or discharge to rest may converge to an open circuit voltage (OCV). Specifically, when the battery module 11 is switched from charge or discharge to rest, the relaxation voltage of the battery cell $B_j$ changes toward the OCV as polarization occurred in the battery cell $B_j$ is spontaneously mitigated.

The battery diagnosis apparatus 100 includes a battery monitor 110 and a control circuit 120. The battery diagnosis apparatus 100 may further include a communication circuit 130. Hereinafter, assume that the battery diagnosis apparatus 100 includes the battery monitor 110, the control circuit 120 and the communication circuit 130.

The battery monitor 110 includes a voltage detector 112. The battery monitor 110 may further include a current detector 114.

The voltage detector 112 is connected to positive and negative terminals of each of the plurality of battery cells $B_1 \sim B_N$ included in the battery module 11 and is configured to detect a voltage (also referred to as a 'cell voltage') across the battery cell $B_j$, and generate a voltage signal indicating the detected cell voltage.

The current detector 114 is connected in series to the battery module 11 through a current path between the battery module 11 and the inverter 31. The current detector 114 may include at least one of the known current detection devices such as a shunt resistor and a hall effect device. When the plurality of battery cells $B_1 \sim B_N$ is connected in series as shown in FIG. 1, the same charge/discharge current flows in the plurality of battery cells $B_1 \sim B_N$.

FIG. 1 shows a shunt resistor used as the current detector 114. In this case, the current detector 114 may output a current signal indicating a direction and size of the charge/discharge current to the control circuit 120 based on a voltage across the shunt resistor according to the ohm's law.

The control circuit 120 may be operably coupled to the relay 20, the battery monitor 110 and the communication circuit 130. Being operably coupled refers to being directly/indirectly connected to transmit and receive a signal in one or two directions.

The control circuit 120 may be referred to as a 'battery controller', and may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control circuit 120 may collect the voltage signal and/or the current signal from the battery monitor 110. For example, the control circuit 120 may convert and record the analog signal collected from the battery monitor 110 to a digital value using an Analog to Digital Converter (ADC) provided therein. Alternatively, the battery monitor 110 itself may transmit the conversion result of the analog signal to the digital value to the control circuit 120.

Memory 121 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory 121 may store data and programs required for the computational operation by the control circuit 120. The memory 121 may store data indicating the results of the computational operation by the control circuit 120. The memory 121 may store given functions, logics and algorithms used to detect a micro short circuit in the battery cell $B_j$. The memory 121 may be integrated into the control circuit 120.

The control circuit 120 may turn on the relay 20 in response to the key-on signal from the vehicle controller 2. The control circuit 120 may turn off the relay 20 in response to the key-off signal from the vehicle controller 2. The key-on signal is a signal that requests the switching from rest to cycling. The key-off signal is a signal that requests the switching from cycling to rest. Alternatively, the vehicle controller 2 may take responsibility for the on/off control of the relay 20 instead of the control circuit 120.

The communication circuit 130 is configured to support wired or wireless communication between the control circuit 120 and the vehicle controller 2. The wired communication may be, for example, controller area network (CAN) communication, and the wireless communication may be, for example, Zigbee or Bluetooth communication. The communication protocol is not limited to a particular type and may include any communication protocol that supports the wired/wireless communication between the control circuit 120 and the vehicle controller 2. The communication circuit 130 may include an output device (for example, a display, a speaker) to provide information received from the control circuit 120 and/or the vehicle controller 2 into a recognizable format for the user (a driver).

Figure 2:
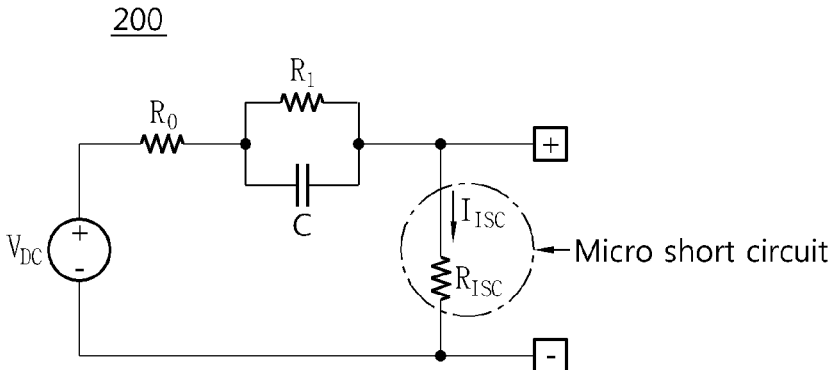
FIG. 2 is a diagram referenced in describing an exemplary equivalent circuit of a battery cell.

FIG. 2 is a diagram referenced in describing an exemplary equivalent circuit of a battery cell. In the specification, a normal battery cell refers to a battery cell without a micro short circuit, and an abnormal battery cell refers to a battery cell with a micro short circuit.

Referring to the equivalent circuit 200 shown in FIG. 2, the abnormal battery cell may be equivalent as a series circuit of a DC power source $V_{DC}$, an internal resistor $R_0$ and a resistor-capacitor (RC) pair $R_1$, C. By contrast, the abnormal battery cell may be equivalent as a series circuit corresponding to the series circuit of the normal battery cell, further including an additional resistor $R_{ISC}$ connected between two terminals +, −. The additional resistor $R_{ISC}$ acts as a path of a leakage current $I_{ISC}$. For reference, the voltage of the DC power source $V_{DC}$ is the OCV of the battery cell $B_j$, and the cell voltage of the battery cell $B_j$ is the total voltage of the series circuit of the DC power source $V_{DC}$, the internal resistor component $R_0$ and the RC pair $R_1$, C. When the charge/discharge current is zero (0 A) and the voltage of the RC pair $R_1$, C is zero (0 V), the relaxation voltage is equal to the OCV.

During the charging of the abnormal battery cell, some of the charge power are not stored in the abnormal battery cell and are used up as the leakage current $I_{ISC}$. Additionally, during the discharging of the abnormal battery cell, some of the discharge power are not supplied to the electrical load 30 and are used up as the leakage current $I_{ISC}$. A decrease in resistance value of the resistor $R_{ISC}$ indicates that a micro short circuit gets worse, and as a micro short circuit gets worse, the power consumption as the leakage current $I_{ISC}$ may increase. As a result, in the charge, a voltage rise of the abnormal battery cell may be smaller than that of the normal battery cell. In contrast, in the discharge, a voltage drop of the abnormal battery cell may be larger than that of the normal battery cell.

Moreover, energy stored in the abnormal battery cell may be used up as the leakage current $I_{ISC}$ even while the battery cell is at rest during which the charge/discharge current is 0. Accordingly, during rest, the voltage of the abnormal battery cell is lower than that of the normal battery cell, and the voltage of the abnormal battery cell drops faster than the normal battery cell.

Hereinafter, operations which are performed by the control circuit 120 to detect a battery cell having a micro short circuit among the plurality of battery cells $B_1$~$B_N$ will be described in detail with reference to FIGS. 3 to 5.

Figure 3:
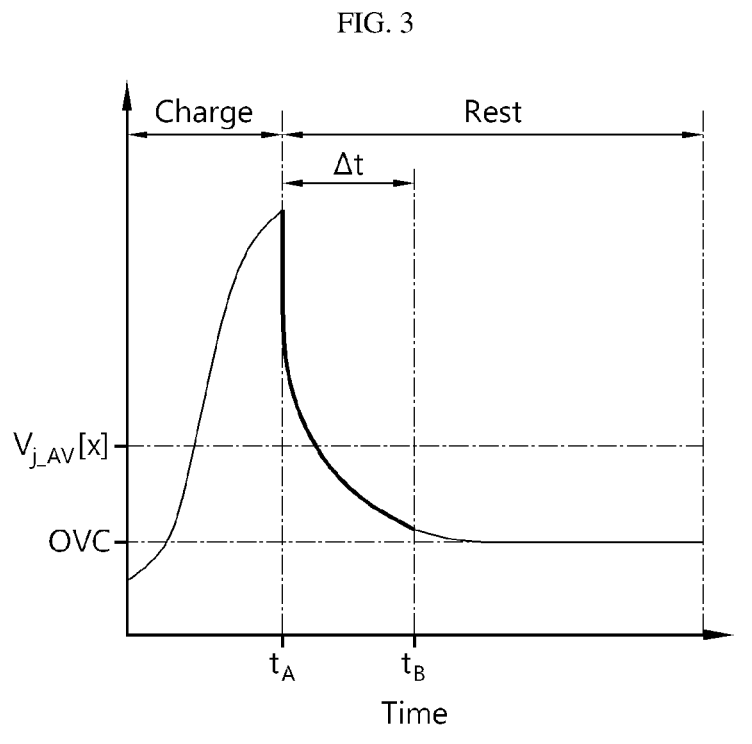
Figure 4:
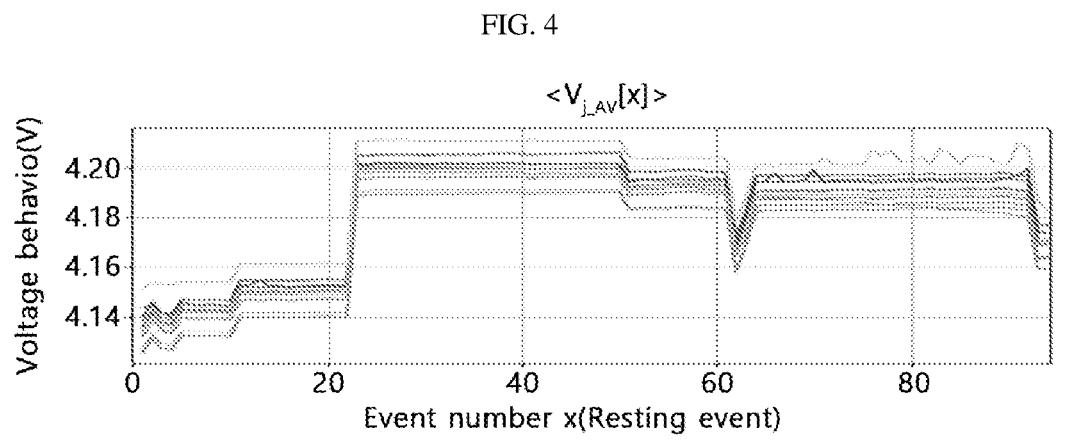
Figure 5:
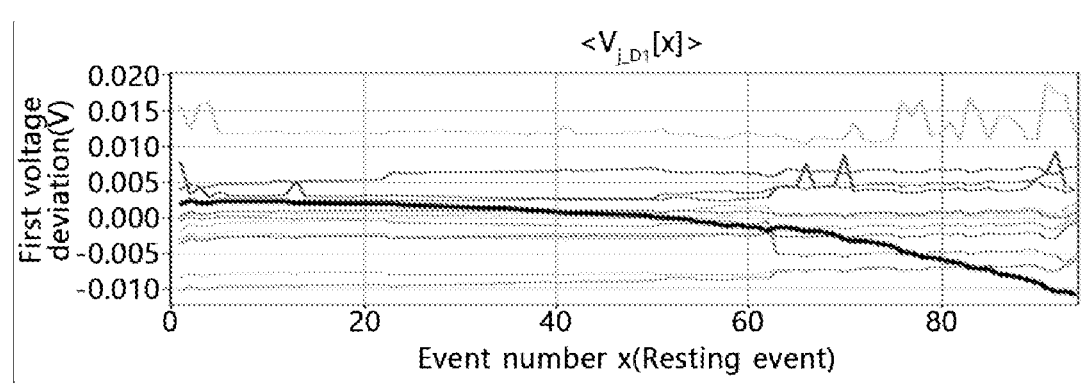
FIG. 5 is a graph exemplarily showing a time-dependent change in first voltage deviation of a battery cell with repeated resting events.

FIG. 3 is a diagram referenced in describing a time-dependent change in voltage of the battery cell during rest, FIG. 4 is a graph exemplarily showing a time-dependent change in voltage behavior of the battery cell with repeated resting events, and FIG. 5 is a graph exemplarily showing a time-dependent change in first voltage deviation of the battery cell with resting events. In FIGS. 4 and 5, the horizontal axis indicates the event number x indicating an order in which the resting event takes place. The vertical axis of FIG. 4 indicates the voltage behavior (the average voltage over the relaxation period) of the battery cell $B_j$ every resting event, and the vertical axis of FIG. 5 indicates the first voltage deviation of the battery cell $B_j$ every resting event.

To begin with, FIG. 3 shows the voltage behavior of any one battery cell $B_j$ of the plurality of battery cells $B_1$~$B_N$ during rest. The time to is the start time of a specific resting event. The resting event is a transition from charging to resting of the battery module 11. The cell voltage of the battery cell $B_j$ keeps rising until the start time $t_A$, and instantaneously drops at the start time $t_A$ when the charge current becomes 0, and then converges toward OCV. The time $t_B$ is a time after the elapse of a predetermined relaxation time $\Delta t$ since the start time $t_A$.

The voltage behavior of the battery cell $B_j$ indicates the average of voltages of the battery cell $B_j$ detected a predetermined number of times in a sequential order over the relaxation period $\Delta t$ from the time $t_A$ to the time $t_B$. The relaxation period $\Delta t$ may be a predetermined multiple of the time interval at which the voltage of the battery cell $B_j$ is detected. For example, the relaxation period $\Delta t$ may be 60 sec, and the voltage of the battery cell $B_j$ may be detected a total of 600 times in a sequential order at the interval of 0.1 sec. Accordingly, the voltage behavior of each of the plurality of battery cells $B_1$~$B_N$ during the resting time from the time $t_A$ to the time $t_B$ may be determined. The following Equation 1 is an example of a function used to calculate the voltage behavior of the battery cell $B_j$ among the plurality of battery cells $B_1$~$B_N$.

$$V_{j\_AV}[x] = \frac{\sum_{i=1}^{S} V_j[i][x]}{S} \qquad \text{<Equation 1>}$$

In Equation 1, S is the total number of times the voltage is detected for the relaxation period $\Delta t$ (for example, 600), $V_j[i][x]$ is the voltage of the battery cell $B_j$ at an i-th detection timing during rest by the event number x of resting events, and $V_{j\_Av}[x]$ is the average of voltages of the battery cell $B_j$ detected S times for the relaxation period $\Delta t$ by the event number x of resting events.

The control circuit 120 monitors the voltage behavior of the battery cell $B_j$ during rest each time the resting event takes place (i.e., each time the event number x increases by 1). Accordingly, as shown in FIG. 4, a time series indicating a time-dependent time in the plurality of voltage behaviors $V_{1\_AV}[x]$~$V_{N\_AV}[x]$ of the plurality of battery cells $B_1$~$B_N$ with repeated resting events is recorded in the memory 121.

The control circuit 120 determines the latest value of the first voltage deviation of the battery cell $B_j$ each the resting event takes place. The first voltage deviation of the battery cell $B_j$ indicates a difference between the voltage behavior of the battery cell $B_j$ and the average voltage behavior of the plurality of battery cells $B_1$~$B_N$. The following Equation 2 is an example of a function used to calculate the first voltage deviation of the battery cell $B_j$.

$$V_{j\_D1}[x] = V_{j\_AV}[x] - V_M[x] = V_{j\_AV}[x] - \frac{\sum_{j=1}^{N} V_{j\_AV}[x]}{N} \quad \text{<Equation 2>}$$

In Equation 2, $V_M[x]$ is the average voltage behavior of the plurality of battery cells $B_1 \sim B_N$ corresponding to the event number x of resting events, and $V_{j\_D1}[x]$ is the first voltage deviation of the battery cell $B_j$ corresponding to the event number x of resting events. That is, each time the event number x increases by 1, $V_{1\_D1}[x]$ to $V_{N\_D1}[x]$ associated with the plurality of battery cells $B_1 \sim B_N$ may be calculated. Accordingly, as shown in FIG. 5, a time series indicating the time-dependent change in the plurality of first voltage deviations $V_{1\_D1}[x] \sim V_{N\_D1}[x]$ of the plurality of battery cells $B_1 \sim B_N$ as the resting event repeats is recorded in the memory 121. Meanwhile, in FIG. 5, among the plurality of first voltage deviation curves, the specific curve marked by the thick solid line has a faster decline in the first voltage deviation with the increasing event number x than the other curves.

Hereinafter, processes which are additionally performed by the control circuit 120 to detect a micro short circuit will be described with reference to FIGS. 6 to 9. The processes related to FIGS. 6 to 9 may be performed when the condition is satisfied: the total number of times the resting events have taken place (i.e., the event number x of resting events that have recently taken place) is equal to or larger than a reference number of times. Additionally, for convenience of description, the graphs shown in FIGS. 6 to 9 relate to the single curve (associated with the abnormal battery cell) marked by the thick solid line among the plurality of first voltage deviation curves shown in FIG. 5.

Figure 6:
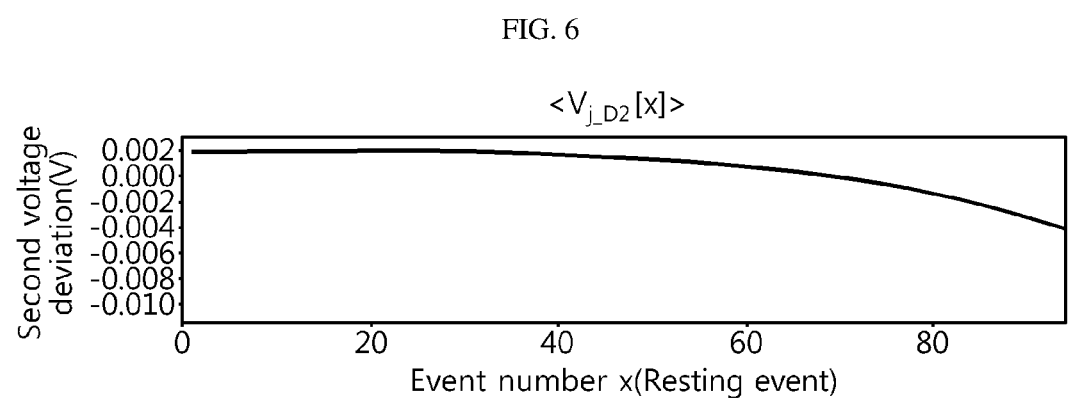
Figure 7:
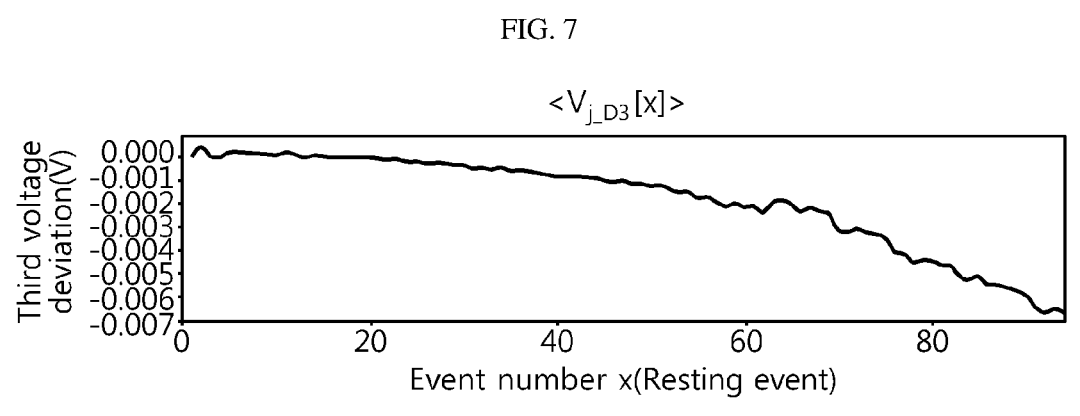
Figure 8:
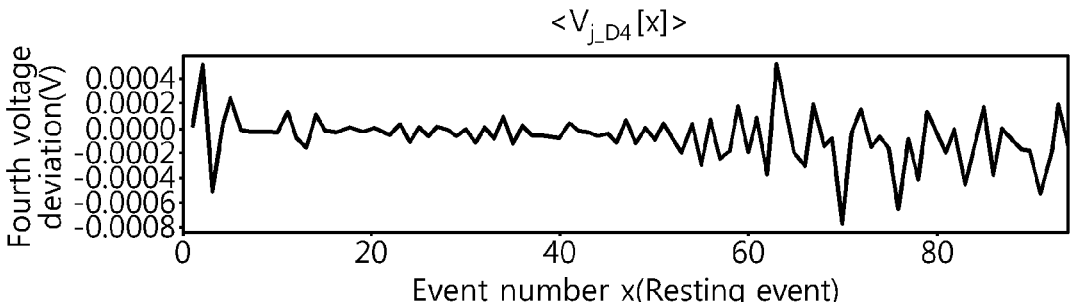
FIG. 8 is a graph exemplarily showing a time-dependent change in fourth voltage deviation of a battery cell with repeated resting events.
Figure 9:
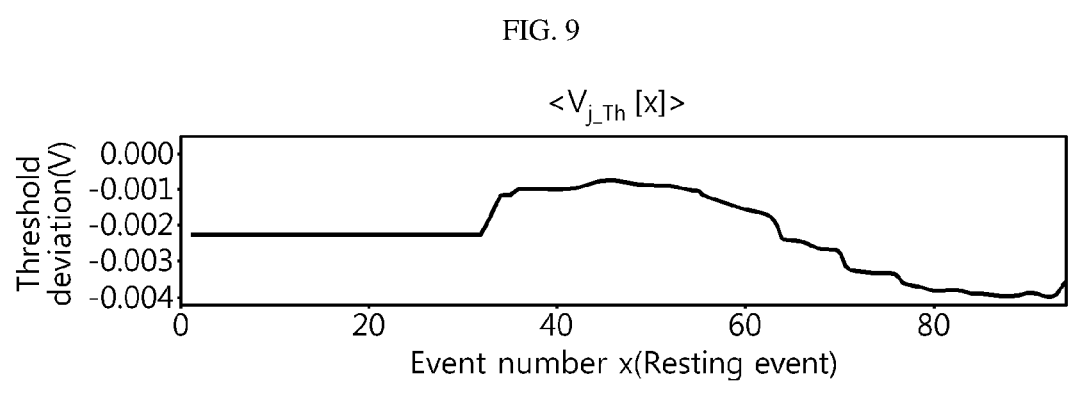

FIG. 6 is a graph exemplarily showing a time-dependent change in second voltage deviation of the battery cell with repeated resting events, FIG. 7 is a graph exemplarily showing a time-dependent change in third voltage deviation of the battery cell with repeated resting events, FIG. 8 is a graph exemplarily showing a time-dependent change in fourth voltage deviation of the battery cell with repeated resting events, and FIG. 9 is a graph exemplarily showing a time-dependent change in threshold deviation for micro short circuit determination of the battery cell with repeated resting events. For convenience of description, FIGS. 6 to 9 only show the single curve showing the time-dependent change in the second voltage deviation associated with the first voltage deviation of the abnormal battery cell.

Referring to FIG. 6, the control circuit 120 may determine the latest value of the second voltage deviation of the battery cell $B_j$ corresponding to the latest value of the first voltage deviation by applying a smoothing algorithm to the latest value of the first voltage deviation of the battery cell $B_j$. A moving average filter is an example of the smoothing algorithm. The following Equation 3 is an example of the moving average filter used to calculate the second voltage deviation of the battery cell $B_j$.

$$V_{j\_D2}[x] = \left\{\left(1 - \frac{1}{W}\right) \times V_{j\_D2}[x-1]\right\} + \left\{\frac{1}{W} \times V_{j\_D1}[x]\right\} \quad \text{<Equation 3>}$$

In Equation 3, W (a natural number of 2 or greater) is the size of the moving average filter, $V_{j\_D2}[x]$ is the second voltage deviation of the battery cell $B_j$ corresponding to the event number x of resting events, and $V_{j\_D2}[x-1]$ is the second voltage deviation of the battery cell $B_j$ corresponding to the event number x−1 of resting events. The latest value of the second voltage deviation of the battery cell $B_j$ may indicate the correction result of the latest value $V_{j\_D1}[x]$ of the first voltage deviation corresponding to the present resting event using the first voltage deviations $V_{j\_D1}[x-W+1] \sim V_{j\_D1}[x-1]$ calculated in association with the past (W−1) resting events. Each time the event number x increases by 1, $V_{1\_D2}[x]$ to $V_{N\_D2}[x]$ associated with the plurality of battery cells $B_1 \sim B_N$ may be newly calculated. Accordingly, a time series (i.e., relationship data between the event number and the second voltage deviation) indicating the time-dependent change in the plurality of second voltage deviations $V_{1\_D2}[x]$ to $V_{N\_D2}[x]$ of the plurality of battery cells $B_1 \sim B_N$ with repeated resting events is recorded in the memory 121. The smoothing algorithm may be replaced by any other algorithm (for example, a double exponential smoothing filter) than Equation 3.

Referring to FIG. 7, the control circuit 120 determines the latest value of the third voltage deviation indicating a difference between the latest value of the first voltage deviation and the latest value of the second voltage deviation. The following Equation 4 shows a relationship between the first voltage deviation, the second voltage deviation and the third voltage deviation.

$$V_{j\_D3}[x] = V_{j\_D1}[x] - V_{j\_D2}[x] \quad \text{<Equation 4>}$$

In Equation 4, $V_{j\_D3}[x]$ is the third voltage deviation of the battery cell $B_j$ corresponding to the event number x of resting events. The third voltage deviation of the battery cell $B_j$ indicates a deepening trend of the micro short circuit in the battery cell $B_j$. Each time the event number x increases by 1, $V_{1\_D3}[x]$ to $V_{N\_D3}[x]$ associated with the plurality of battery cells $B_1 \sim B_N$ may be calculated. Accordingly, a time series (i.e., relationship data between the event number and the third voltage deviation) indicating the time-dependent change in the plurality of third voltage deviations $V_{1\_D3}[x]$ to $V_{N\_D3}[x]$ of the plurality of battery cells $B_1 \sim B_N$ with repeated resting events is recorded in the memory 121.

Referring to FIG. 8, the control circuit 120 determines the latest value of the fourth voltage deviation indicating a difference between the latest value of the third voltage deviation and the previous value of the third voltage deviation. The fourth voltage deviation of the battery cell $B_j$ indicates fluctuations in the deepening trend of the micro short circuit in the battery cell $B_j$. The following Equation 5 shows a relationship between the third voltage deviation and the fourth voltage deviation.

$$V_{j\_D4}[x] = V_{j\_D3}[x] - V_{j\_D3}[x-1] \quad \text{<Equation 5>}$$

In Equation 5, $V_{j\_D4}[x]$ is the fourth voltage deviation of the battery cell $B_j$ corresponding to the event number x of resting events. When x is the present event number, $V_{j\_D3}[x]$ is the latest value of the third voltage deviation, and $V_{j\_D3}[x-1]$ is the previous value of the third voltage deviation. Each time the event number x increases by 1, $V_{1\_D4}[x]$ to $V_{N\_D4}[x]$ associated with the plurality of battery cells $B_1 \sim B_N$ may be calculated. Accordingly, a time series (i.e., relationship data between the event number and the fourth voltage deviation) indicating the time-dependent change in the plurality of fourth voltage deviations $V_{1\_D4}[x]$ to $V_{N\_D4}[x]$ of the plurality of battery cells $B_1 \sim B_N$ with repeated resting events is recorded in the memory 121.

Referring to FIG. 9, the control circuit 120 determines the latest value of the threshold deviation for the battery cell $B_j$ using a dispersion of the time series of the fourth voltage deviation having a predetermined size (a natural number of 2 or greater). The following Equation 6 is an example of a function used to calculate the standard deviation as the dispersion of the time series of the fourth voltage deviation of the battery cell $B_j$.

$$\sigma_j[x] = \sqrt{\frac{\sum_{i=x-y+1}^{x}(V_{j\_D4}[i] - V_{j\_D4\_AV})^2}{y}} \qquad \text{<Equation 6>}$$

In Equation 6, $\sigma_j[x]$ is the standard deviation of the time series (size y) of the fourth voltage deviation of the battery cell $B_j$, and $V_{j\_D4\_AV}$ is the average of the time series (size y) of the fourth voltage deviation. $\sigma_j[x]$ corresponds to the event number x of resting events.

The control circuit 120 may determine the latest value $V_{j\_Th}[x]$ of the threshold deviation used to detect a micro short circuit in the battery cell $B_j$ to be equal to a value obtained by multiplying the dispersion $\sigma_j[x]$ by a predetermined margin constant. For example, $V_{j\_Th}[x]=\sigma_j[x]\times Q$. Q is the margin constant. Accordingly, each time the event number x increases by 1, $V_{1\_Th}[x]$ to $V_{N\_Th}[x]$ associated with the plurality of battery cells $B_1\sim B_N$ may be calculated. Accordingly, a time series (i.e., relationship data between the event number and the threshold deviation) indicating the time-dependent change in the plurality of threshold deviations $V_{1\_Th}[x]$ to $V_{N\_Th}[x]$ of the plurality of battery cells $B_1\sim B_N$ with repeated resting events is recorded in the memory 121. The curve of FIG. 9 shows a time series of the threshold deviation associated with the abnormal battery cell (see the thick line of FIG. 5) when y and Q are 100 and −15, respectively.

Each time the event number x increases by 1, the control circuit 120 may determine whether the corresponding battery cell $B_j$ has micro short circuit by comparing the latest value $V_{j\_D3}[x]$ of the third voltage deviation associated with the battery cell $B_j$ with the latest value $V_{j\_Th}[x]$ of the threshold deviation.

Each time the event number x increases by 1, when $V_{j\_D3}[x]\leq V_{j\_Th}[x]$, the control circuit 120 may increase an abnormality factor indicating that a micro short circuit is likely to occur in the battery cell $B_j$, and otherwise, the control circuit 120 may decrease the abnormality factor. For example, the abnormality factor may increase by a first value (for example, 10) from the previous value or at a first ratio (for example, 10%) of the previous value. The abnormality factor may decrease by a second value (for example, 1) from the previous value or at a second ratio (for example, 2%) of the previous value. The control circuit 120 may determine that there is a micro short circuit in the battery cell $B_j$ in response to the abnormality factor associated with the battery cell $B_j$ being equal to or larger than a threshold (for example, 100). The control circuit 120 may reset the abnormality factor associated with the battery cell $B_j$ to an initial value (for example, 0), in response to the condition of $V_{j\_D3}[x]>V_{j\_Th}[x]$ being continuously satisfied while the event number x increases to a predetermined value (for example, 10). The initial value is the lower limit value of the abnormality factor.

Those skilled in the art will easily understood that when Q is a positive number (for example, 15), not a negative number (for example, −15), the abnormality factor increase condition will be contrary, i.e., $V_{j\_D3}[x]\geq V_{j\_Th}[x]$.

Figure 11:
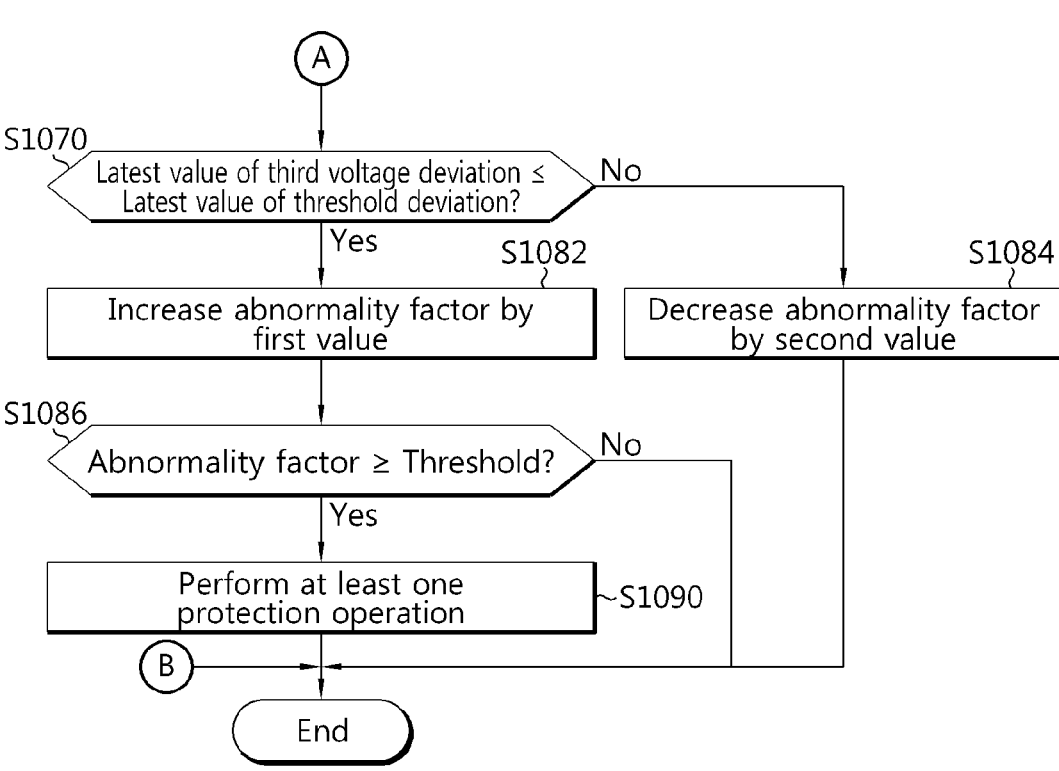

FIGS. 10 and 11 are flowcharts referenced in exemplarily describing a battery diagnosis method according to an embodiment of the present disclosure. The method of FIGS. 10 and 11 may start each time the resting event of in which the battery module 11 transitions from charging to resting takes place. For reference, a value that is larger than the previous event number by 1 may be assigned to the event number x of the resting event newly generated.

Referring to FIGS. 1 to 11, in step S1010, the control circuit 120 determines, for each of the plurality of battery cells $B_1\sim B_N$, the latest value $V_{j\_D1}[x]$ of the first voltage deviation indicating a difference between the voltage behavior $V_{j\_AV}[x]$ of the battery cell $B_j$ and the average voltage behavior $V_M[x]$ of the plurality of battery cells $B_1\sim B_N$ over the relaxation period $\Delta t$ from the start time of the resting event (see Equations 1 and 2). $V_{j\_D1}[x]$ may be recorded in the memory 121.

In step S1020, the control circuit 120 determines if the total number of times the resting events have taken place is equal to or larger than the reference number of times. When a value of the step S1020 is "Yes", step S1030 is performed. The total number of times may indicate the maximum value among the event numbers assigned to the resting events that have taken place so far.

In step S1030, the control circuit 120 determines, for each of the plurality of battery cells $B_1\sim B_N$, the latest value $V_{j\_D2}[x]$ of the second voltage deviation corresponding to the latest value $V_{j\_D1}[x]$ of the first voltage deviation by applying the smoothing algorithm to the latest value $V_{j\_Av}[x]$ of the first voltage deviation (see Equation 3). The latest value $V_{j\_D2}[x]$ of the second voltage deviation may be a weighted average of the latest value $V_{j\_D1}[x]$ of the first voltage deviation and the previous value $V_{j\_D2}[x-1]$ of the second voltage deviation. $V_{j\_D2}[x]$ may be recorded in the memory 121.

In step S1040, the control circuit 120 determines, for each of the plurality of battery cells $B_1\sim B_N$, the latest value $V_{j\_D3}[x]$ of the third voltage deviation indicating a difference between the latest value $V_{j\_D1}[x]$ of the first voltage deviation and the latest value $V_{j\_D2}[x]$ of the second voltage deviation (see Equation 4). $V_{j\_D3}[x]$ may be recorded in the memory 121.

In step S1050, the control circuit 120 determines, for each of the plurality of battery cells $B_1\sim B_N$, the latest value $V_{j\_D4}[x]$ of the fourth voltage deviation indicating a difference between the latest value $V_{j\_D3}[x]$ of the third voltage deviation and the previous value $V_{j\_D3}[x-1]$ of the third voltage deviation (see Equation 5). $V_{j\_D4}[x]$ may be recorded in the memory 121.

In step S1060, the control circuit 120 determines, for each of the plurality of battery cells $B_1\sim B_N$, the latest value $V_{j\_Th}[x]$ of the threshold deviation using the dispersion (for example, the standard deviation $\sigma_j[x]$) of the time series $V_{j\_D4}[x-y+1]$ $V_{j\_D4}[x]$ of the fourth voltage deviation having the predetermined size y (see Equation 6).

In step S1070, the control circuit 120 determines, for each of the plurality of battery cells $B_1\sim B_N$, if the condition of $V_{j\_D3}[x]\leq V_{j\_Th}[x]$ is satisfied by comparing the latest value $V_{j\_D3}[x]$ of the third voltage deviation with the latest value $V_{j\_Th}[x]$ of the threshold deviation. $V_{j\_D3}[x]\leq V_{j\_Th}[x]$ indicates that a micro short circuit is likely to occur in the battery cell $B_j$. When a value of the step S1070 is "Yes", S1082 is performed. When the value of the step S1070 is "No", S1084 may be performed.

In the step S1082, the control circuit 120 increases the abnormality factor associated with the battery cell $B_j$ that satisfies the condition of $V_{j\_D3}[x]\leq V_{j\_Th}[x]$ among the plurality of battery cells $B_1\sim B_N$ by the first value.

In the step S1084, the control circuit 120 decreases the abnormality factor associated with the battery cell $B_j$ that does not satisfy the condition of $V_{j\_D3}[x] \leq V_{j\_Th}[x]$ among the plurality of battery cells $B_1 \sim B_N$ by the second value.

In step S1086, the control circuit 120 determines if the abnormality factor associated with the battery cell $B_j$ that satisfies the condition of $V_{j\_D3}[x] \leq V_{j\_Th}[x]$ is equal to or larger than the threshold. A value of the step S1084 being "Yes" indicates that a micro short circuit is detected in the battery cell $B_j$. When the value of the step S1084 is "Yes", S1090 may be performed.

In the step S1090, the control circuit 120 performs at least one protection operation. The protection operation may include generating a diagnosis message notifying an identification number and/or a location of the battery cell $B_j$ associated with the abnormality factor of the threshold or more. The diagnosis message may be transmitted to the vehicle controller 2 and/or the vehicle user through the communication circuit 130. The protection operation may include the off control of the relay 20.

The embodiments of the present disclosure described hereinabove are not implemented only through the apparatus and method, and may be implemented through programs that perform the functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the appended claims and equivalents thereof.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and all or some of the embodiments may be selectively combined to allow various modifications.

| (Description of Reference Numerals) | |
|---|---|
| 1: Electric vehicle | 2: Vehicle controller |
| 10: Battery pack | 11: Battery module |
| B: Battery cell | |
| 100: Battery diagnosis apparatus | 110: Battery monitor |
| 120: Control circuit | 130: Communication circuit |

What is claimed is:

1. A battery diagnosis apparatus, comprising:
a battery monitor configured to detect a voltage of each of a plurality of battery cells included in a battery module; and
a control circuit of an electrical vehicle configured to:
determine a latest value of a first voltage deviation indicating a difference between a voltage behavior of a battery cell of the plurality of battery cells and an average voltage behavior of the plurality of battery cells over a relaxation period from a start time of a resting event in which the battery module transitions from charging to resting, when a total number of times the resting event has taken place is equal to or larger than a reference number of times;
determine a latest value of a second voltage deviation of the battery cell, wherein the second voltage deviation corresponds to the latest value of the first voltage deviation applied to a smoothing algorithm;
determine a latest value of a third voltage deviation of the battery cell indicating a first difference between the latest value of the first voltage deviation and the latest value of the second voltage deviation;
determine a latest value of a fourth voltage deviation of the battery cell indicating a second difference between the latest value of the third voltage deviation and a previous value of the third voltage deviation;
determine a latest value of a threshold deviation of the battery cell using a dispersion of a time series of the fourth voltage deviation having a predetermined size; and
determine whether the battery cell has a micro short circuit based on a comparison of the latest value of the third voltage deviation with the latest value of the threshold deviation.

2. The battery diagnosis apparatus according to claim 1, wherein, for each battery cell, the voltage behavior of the battery cell indicates an average of a predetermined number of detected voltages of the battery cell over the relaxation period from the start time of the resting event.

3. The battery diagnosis apparatus according to claim 1, wherein the smoothing algorithm is a moving average filter, and
wherein the reference number of times is equal to or greater than a size of the moving average filter.

4. The battery diagnosis apparatus according to claim 1, wherein the dispersion is a standard deviation.

5. The battery diagnosis apparatus according to claim 1, wherein the control circuit is configured to determine, for each of the plurality of battery cells, the latest value of the threshold deviation by multiplying the dispersion by a predetermined margin constant.

6. The battery diagnosis apparatus according to claim 1, wherein the control circuit is configured to,
for each of the plurality of battery cells, increase a factor associated with the battery cell by a first value when the latest value of the third voltage deviation is equal to or smaller than the latest value of the threshold deviation; and
determine that at least one of the plurality of battery cells has the micro short circuit when the factor associated with the at least one of the plurality of battery cells reaches a threshold.

7. The battery diagnosis apparatus according to claim 6, wherein the control circuit is configured to decrease, the factor associated with the at least one of the plurality of battery cells by a second value when the latest value of the third voltage deviation is larger than the latest value of the threshold deviation.

8. A battery pack comprising the battery diagnosis apparatus according to claim 1.

9. An electric vehicle comprising the battery pack according to claim 8.

10. A battery diagnosis method, comprising:
detecting, by a battery monitor, a voltage of each of a plurality of battery cells included in a battery module;
determining, by a control circuit of an electrical vehicle-processor, a latest value of a first voltage deviation indicating a difference between a voltage behavior of a battery cell of the plurality of battery cells and an average voltage behavior of the plurality of battery cells over a relaxation period from a start time of a resting event in which a battery module including the plurality of battery cells transitions from charging to resting, when a total number of times the resting event has taken place is equal to or larger than a reference number of times;

determining, by the control circuit, a latest value of a second voltage deviation of the battery cell, wherein the second voltage deviation corresponds to the latest value of the first voltage deviation applied to a smoothing algorithm-;

determining, by the control circuit, a latest value of a third voltage deviation of the battery indicating a first difference between the latest value of the first voltage deviation and the latest value of the second voltage deviation, determining, by the control circuit, a latest value of a fourth voltage deviation of the battery cell indicating a second difference between the latest value of the third voltage deviation and a previous value of the third voltage deviation;

determining, by the control circuit, a latest value of a threshold deviation of the battery cell using a dispersion of a time series of the fourth voltage deviation having a predetermined size; and determining, by the control circuit, whether the battery cell has a micro short circuit based on a comparison of the latest value of the third voltage deviation with the latest value of the threshold deviation.

11. The battery diagnosis method according to claim 10, wherein, for each battery cell, the voltage behavior of the battery cell indicates an average of a predetermined number of detected voltages of the battery cell over the relaxation period from the start time of the resting event.

12. The battery diagnosis method according to claim 10, wherein the smoothing algorithm is a moving average filter, and wherein the reference number of times is equal to or greater than a size of the moving average filter.

13. The battery diagnosis method according to claim 10, wherein the dispersion is a standard deviation.

14. The battery diagnosis method according to claim 10, wherein the latest value of the threshold deviation is equal to a multiplication of the dispersion by a predetermined margin constant.

15. The battery diagnosis method according to claim 10, further comprising performing, by the control circuit, a protection operation in response to determining the battery cell has the micro short circuit, wherein the protection operation includes turning off a relay connected in series to the plurality of battery cells through a power path connecting the plurality of battery cells to an electrical load.

* * * * *